(12) United States Patent
Nakayama et al.

(10) Patent No.: US 11,536,383 B2
(45) Date of Patent: Dec. 27, 2022

(54) VENTILATION COMPONENT

(71) Applicant: NITTO DENKO CORPORATION, Ibaraki (JP)

(72) Inventors: Yusuke Nakayama, Osaka (JP); Youzou Yano, Osaka (JP); Akira Miyagaki, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 17/287,276

(22) PCT Filed: Oct. 17, 2019

(86) PCT No.: PCT/JP2019/040957
§ 371 (c)(1),
(2) Date: Apr. 21, 2021

(87) PCT Pub. No.: WO2020/085212
PCT Pub. Date: Apr. 30, 2020

(65) Prior Publication Data
US 2021/0396324 A1    Dec. 23, 2021

(30) Foreign Application Priority Data
Oct. 25, 2018  (JP) .............................. JP2018-201128

(51) Int. Cl.
*F16K 15/14*    (2006.01)
*H01M 50/30*    (2021.01)
(Continued)

(52) U.S. Cl.
CPC ............ *F16K 15/148* (2013.01); *F16K 24/04* (2013.01); *H01M 50/325* (2021.01);
(Continued)

(58) Field of Classification Search
CPC .... F16K 15/148; F16K 24/04; F16K 27/0209; H01M 5/325; H01M 5/394; Y10T 137/789
See application file for complete search history.

(56) References Cited

U.S. PATENT DOCUMENTS 5,320,253 A * 6/1994 Robinson ............ A01M 7/0085
222/481.5
5,981,099 A * 11/1999 Bourbeau ........... H01M 50/394
429/82
(Continued)

FOREIGN PATENT DOCUMENTS

DE    202015100970 U1    3/2015
DE    102017003360 B3    7/2018
(Continued)

OTHER PUBLICATIONS

International Search Report and Written Opinion issued for International Patent Application No. PCT/JP2019/040957, dated Dec. 24, 2019, 12 pages including English translation of Search Report.

*Primary Examiner* — Hailey K. Do
(74) *Attorney, Agent, or Firm* — Hamre, Schumann, Mueller & Larson, P.C.

(57) ABSTRACT

A ventilation component (1) includes a gas-permeable membrane (10), a ventilation valve (20), and a structural member (30). The ventilation component (1) is to be attached to a housing (2) having a ventilation opening (5). The ventilation valve (20) includes an elastic body, and is opened and closed by elastic deformation of the elastic body. The structural member (30) supports the gas-permeable membrane (10) and the ventilation valve (20). In an attached state where the ventilation component (1) is attached to the housing (2), ventilation between an inside of the housing (2) and an outside of the housing (2) is carried out via the gas-permeable membrane (10), and the ventilation valve (20) is
(Continued)

opened to discharge a gas inside the housing 2 to the outside of the housing 2 when a difference between a pressure inside the housing (2) and a pressure outside the housing (2) is equal to or higher than a predetermined value. The elastic body included in the ventilation valve (20) is formed of a rubber whose rate of change in breaking strength is 95% to 120%.

4 Claims, 6 Drawing Sheets

(51) Int. Cl.
  *H01M 50/383* (2021.01)
  *H01M 50/325* (2021.01)
  *F16K 24/04* (2006.01)
  *H05K 5/02* (2006.01)
  *H01M 50/317* (2021.01)

(52) U.S. Cl.
  CPC ....... *H01M 50/383* (2021.01); *H01M 50/394* (2021.01); *H05K 5/0213* (2013.01); *H01M 50/317* (2021.01)

(56) References Cited

U.S. PATENT DOCUMENTS

| | | | | |
|---|---|---|---|---|
| 2007/0117931 | A1* | 5/2007 | Inoue | C08C 1/04 525/237 |
| 2010/0032039 | A1* | 2/2010 | Nemoto | H01M 8/2465 137/843 |
| 2013/0032219 | A1* | 2/2013 | Heim | H01M 50/3425 137/197 |
| 2015/0217906 | A1* | 8/2015 | Ichikawa | B65D 75/5883 222/92 |
| 2018/0292020 | A1* | 10/2018 | Kleinke | F16K 15/148 |
| 2020/0340592 | A1 | 10/2020 | Nakayama et al. | |

FOREIGN PATENT DOCUMENTS

| | | |
|---|---|---|
| JP | S55158359 U | 11/1980 |
| JP | 2004067831 | 3/2004 |
| JP | 2016056902 | 4/2016 |
| WO | 2008111356 | 9/2008 |
| WO | 2018183804 | 10/2018 |
| WO | 2018199238 | 11/2018 |

* cited by examiner

VENTILATION COMPONENT

TECHNICAL FIELD

The present invention relates to a ventilation component.

BACKGROUND ART

Conventionally, there have been known devices for compensating a difference between a pressure inside a housing and a pressure outside the housing.

For example, Patent Literature 1 describes a pressure compensating device that can be used for a housing that should avoid an undesirable difference between a pressure inside the housing and a pressure outside the housing. This pressure compensating device has an inner side and an outer side, and includes a cage, a gas-permeable membrane, and a pressure release valve. The cage includes an inner half and an outer half. In an inside of the cage, the gas-permeable membrane and the pressure release valve are disposed between the inner half and the outer half. Explosion prevention is achieved by the pressure release valve. When a pressure in the inner side is higher than a pressure in the outer side and a difference therebetween exceeds a threshold, a flow path that allows the inner side to be connected directly to the outer side is formed so that a gas in the inner side is discharged urgently. The gas-permeable membrane does not contribute to the explosion prevention. The pressure release valve has an outer circumferential portion that seals a sealing surface of the cage by using an elasticity-derived pressure.

CITATION LIST

Patent Literature

Patent Literature 1: DE 102017003360 B3

SUMMARY OF INVENTION

Technical Problem

In Patent Literature 1, no detailed studies are conducted on a material of an elastic body forming the pressure release valve, and thus the technique described in Patent Literature 1 has room for improvement from the viewpoint of increasing the heat resistance of the pressure release valve. Therefore, the present invention provides a ventilation component that is suitable for ventilation aiming at explosion prevention, and that includes a ventilation valve advantageous from the viewpoint of heat resistance.

Solution to Problem

The present invention provides a ventilation component to be attached to a housing at a ventilation opening of the housing, comprising:

a gas-permeable membrane;

a ventilation valve that includes an elastic body, and that is opened and closed by elastic deformation of the elastic body; and a structural member that supports the gas-permeable membrane and the ventilation valve, wherein in an attached state where the ventilation component is attached to the housing, ventilation between an inside of the housing and an outside of the housing is carried out via the gas-permeable membrane, and the ventilation valve is opened to discharge a gas inside the housing to the outside of the housing when a difference between a pressure inside the housing and a pressure outside the housing is equal to or higher than a predetermined value, and the elastic body is formed of a rubber whose rate of change in breaking strength, determined by formula (1) below, is 95% to 120%;

$$\text{Rate of change in breaking strength} = 100 \times \text{first breaking strength/second breaking strength} \quad (1)$$

where the first breaking strength is a breaking strength observed when a specimen that is made of the rubber, has a thickness of 2.0 mm, and has been punched into No. 3 dumbbell shape is heated in accordance with Heat Resistance Test, Method A, specified in Japanese Industrial Standard (JIS) K 6257:2010 and is then subject to a tensile test at a tensile rate of 500 mm/minute, and the second breaking strength is a breaking strength observed when the specimen is subject to a tensile test at a tensile rate of 500 mm/minute without being heated in accordance with the Heat Resistance Test, Method A.

Advantageous Effects of Invention

The above-mentioned ventilation component is suitable for ventilation aiming at explosion prevention, and includes a ventilation valve advantageous from the viewpoint of heat resistance.

DESCRIPTION OF EMBODIMENTS

A housing of an electrical component of a vehicle, for example, needs to have a ventilating property so as to eliminate a pressure difference that occurs inside thereof due to a temperature change. At the same time, the level of ventilating property required for the housing can vary according to a phenomenon inside the housing. For example, there is a case, such as explosion prevention on a battery pack, in which a lot of gas is required to be discharged from inside of a housing in a short time. Accordingly, it is conceivable to attach a ventilation component including a gas-permeable membrane and a ventilation valve to a ventilation opening of a housing. In this case, regular ventilation is carried out via the gas-permeable membrane in a state where the ventilation valve is closed and, on the other hand, when a difference between a pressure inside the housing and a pressure outside the housing increases to be equal to or higher than a predetermined value, the ventilation valve is opened to discharge a lot of gas from the inside of the housing in a short time, for example. It is possible to reuse the ventilation valve by using, as the ventilation valve, a ventilation valve that is opened and closed by elastic deformation of an elastic body thereof.

In the pressure compensating device described in Patent Literature 1, it is suggested that an outer circumferential portion of the pressure release valve is formed of an elastically-deformable material. In Patent Literature 1, however, no detailed studies are conducted on a material of the pressure release valve from the viewpoint of heat resistance. The present inventors have found that a ventilation component and a product to which the ventilation component is attached are possibly used in a high-temperature environment, and thus it is extremely important to increase the heat resistance of a ventilation valve thereof. In light of this, the present inventors made intensive studies on techniques for increasing the heat resistance of the ventilation valve. As a result, the present inventors newly found that from the viewpoint of increasing the heat resistance of the ventilation valve, it is advantageous to form an elastic body included in the ventilation valve out of a rubber that satisfies a predetermined relationship in terms of breaking strength, and have invented a ventilation component of the present invention. It should be noted that a housing to which the ventilation component of the present invention is to be attached is not limited to a housing of an electrical component of a vehicle.

Hereinbelow, embodiments of the present invention will be described with reference to the accompanying drawings. The following description describes examples of the present invention, and the present invention is not limited to the following embodiments.

Figure 1:
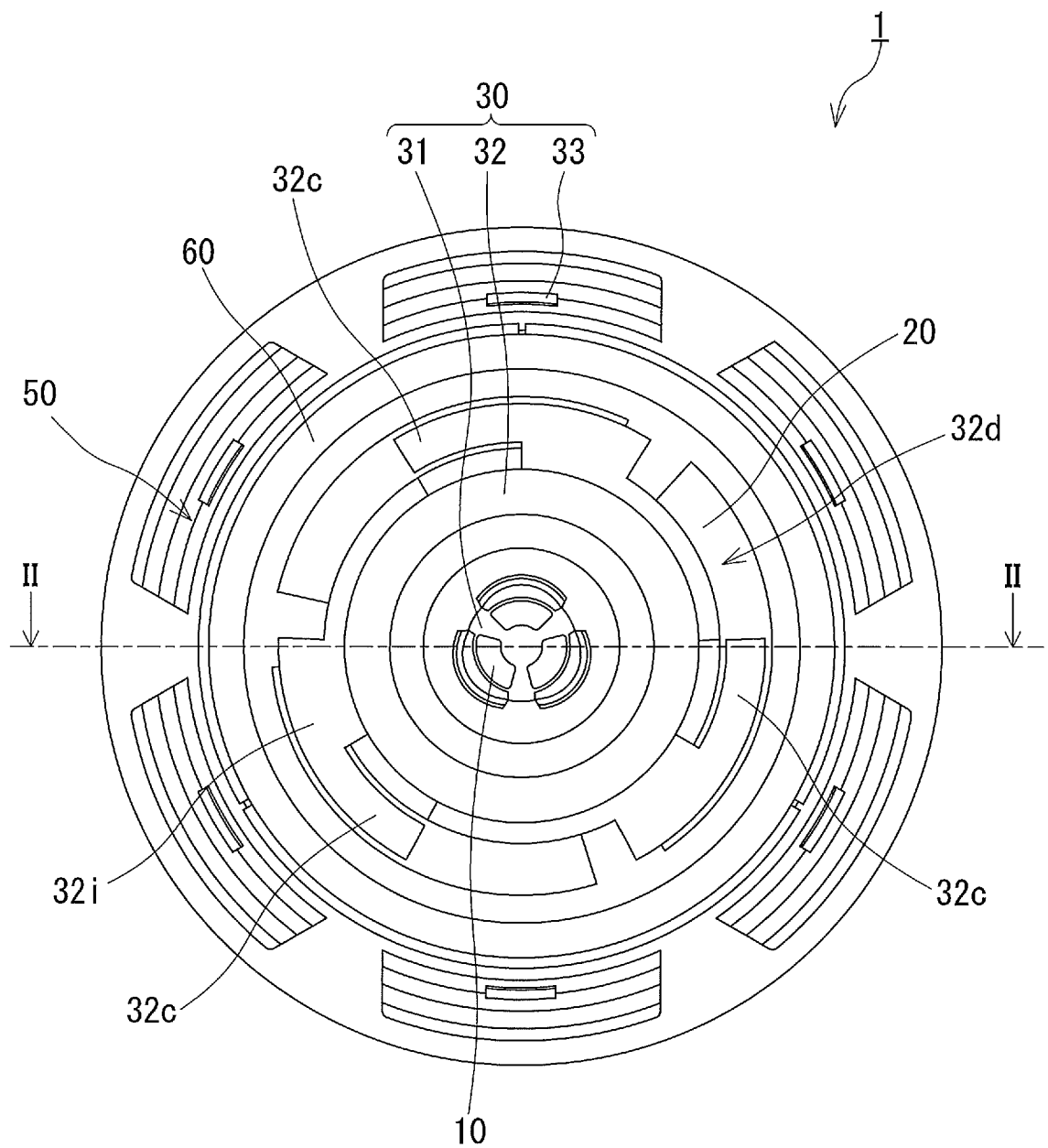
FIG. 1 is a bottom view illustrating an example of a ventilation component of the present invention.
Figure 2:
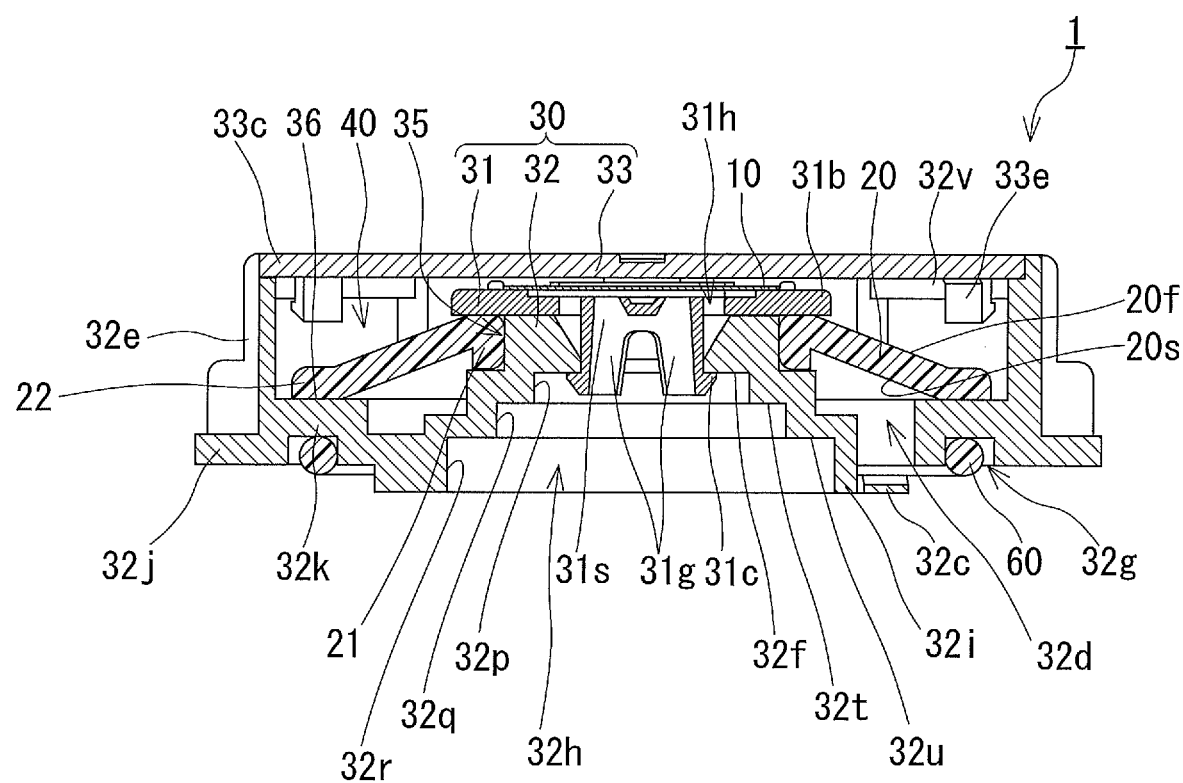
FIG. 2 is a cross-sectional view of the ventilation component shown in FIG. 1, taken along line II-II.
Figure 3:
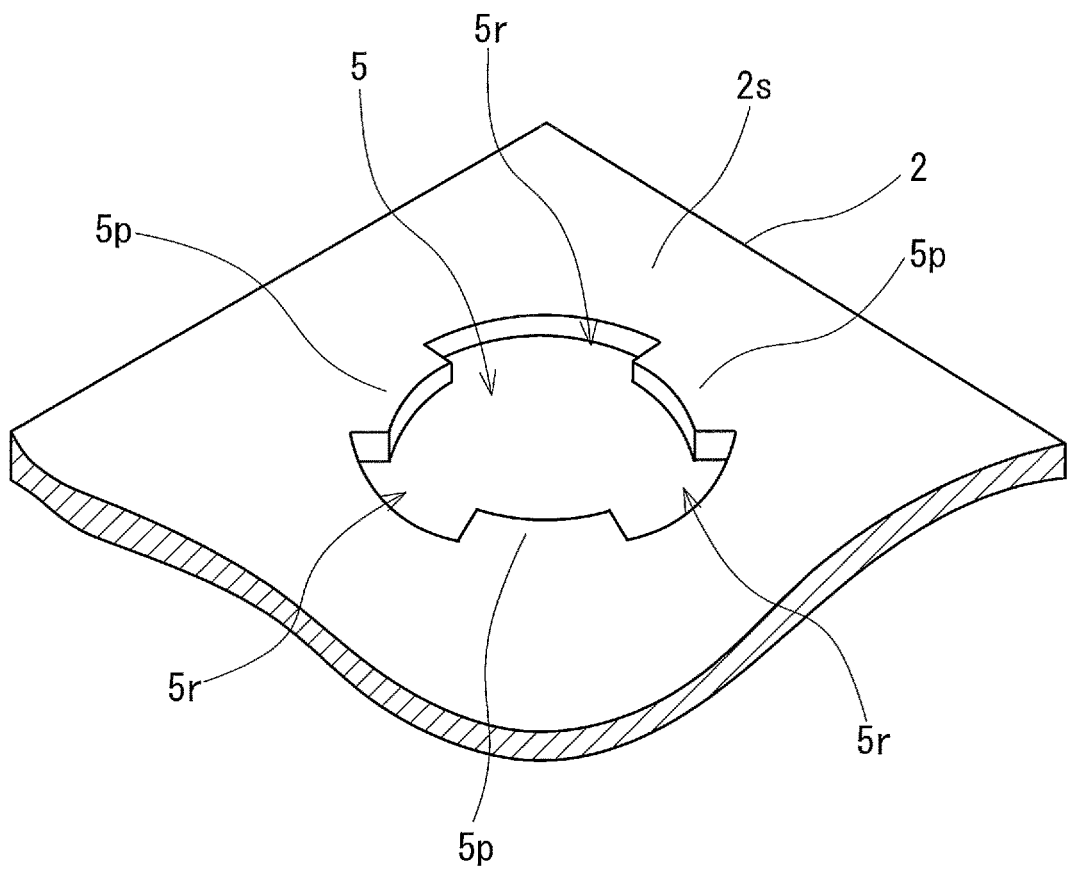
FIG. 3 is a perspective view illustrating a ventilation opening of a housing.
Figure 4:
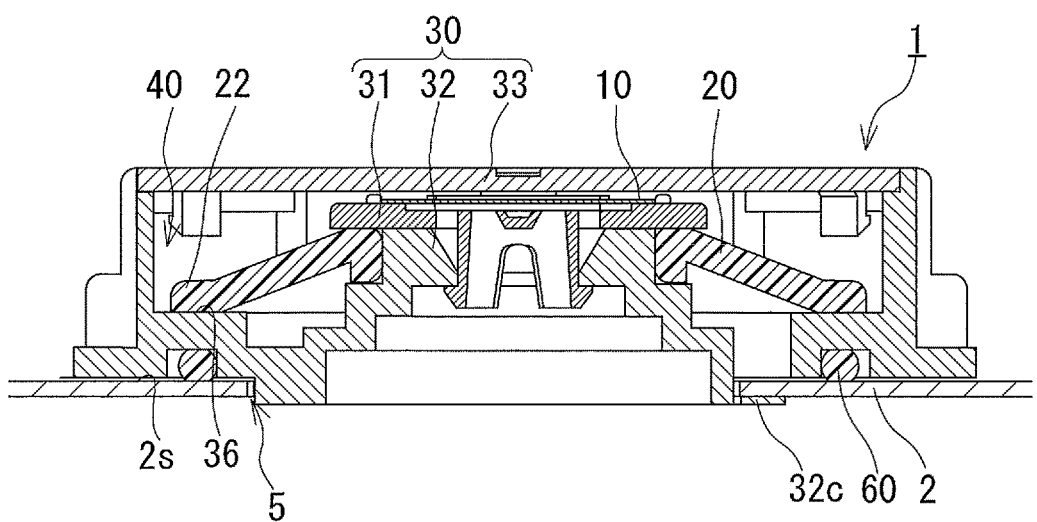
FIG. 4 is a cross-sectional view illustrating a state where the ventilation component is attached to the housing.
Figure 5:
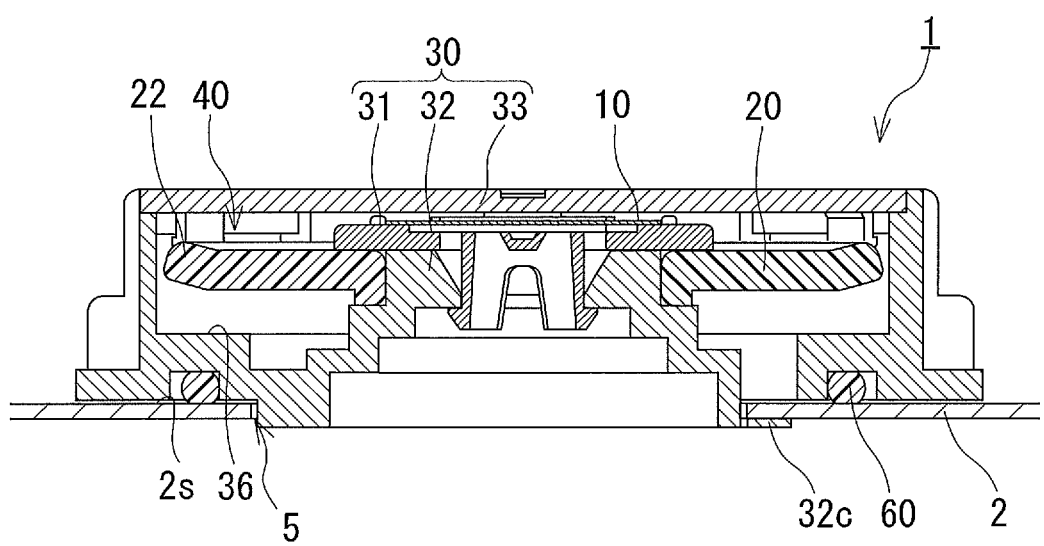
FIG. 5 is a cross-sectional view illustrating a state where a ventilation valve is opened.

As shown in FIG. 1 and FIG. 2, a ventilation component 1 includes a gas-permeable membrane 10, a ventilation valve 20, and a structural member 30. The ventilation component 1 is a component to be attached to a housing 2 having a ventilation opening 5 as shown in FIG. 3. As shown in FIG. 4, the ventilation component 1 is to be attached to the housing 2 at the ventilation opening 5. As shown in FIG. 4 and FIG. 5, the ventilation valve 20 includes an elastic body, and is opened and closed by elastic deformation of the elastic body. The structural member 30 supports the gas-permeable membrane 10 and the ventilation valve 20. In an attached state where the ventilation component 1 is attached to the housing 2, ventilation between an inside of the housing 2 and an outside of the housing 2 is carried out via the gas-permeable membrane 10. Furthermore, in the attached state, the ventilation valve 20 is opened to discharge a gas inside the housing 2 to the outside of the housing 2 when a difference between a pressure inside the housing 2 and a pressure outside the housing 2 is equal to or higher than a predetermined value. In other words, when the difference between the pressure inside the housing 2 and the pressure outside the housing 2 is less than the predetermined value, the ventilation valve 20 is closed. The elastic body included in the ventilation valve 20 is formed of a rubber whose rate of change in breaking strength, determined by formula (1) below, is 95% to 120%. In the present description, this rubber is referred to as a "heat-resisting rubber." In the formula (1), the first breaking strength is a breaking strength observed when a specimen that is made of the rubber, has a thickness of 2.0 mm, and has been punched into No. 3 dumbbell shape is heated in accordance with Heat Resistance Test, Method A, specified in JIS K 6257:2010 and is then subject to a tensile test at a tensile rate of 500 mm/minute. In addition, the second breaking strength is a breaking strength observed when the above-mentioned specimen is subject to a tensile test at a tensile rate of 500 mm/minute without being heated in accordance with the Heat Resistance Test, Method A, mentioned above.

$$\text{Rate of change in breaking strength} = 100 \times \text{first breaking strength} / \text{second breaking strength} \qquad (1)$$

Since the elastic body included in the ventilation valve 20 is formed of the heat-resisting rubber, the breaking strength of the heat-resisting rubber of which the elastic body of the ventilation valve 20 is formed is unlikely to vary even when the ventilation valve 20 is used in a high-temperature environment. In this case, it is assumed that a pressure to open the ventilation valve 20 is unlikely to vary and is likely to fall in a desired range during a period in which the ventilation component 1 is used. This is advantageous in enhancing the reliabilities of the ventilation component 1 and a product to which the ventilation component 1 is attached.

Typically, the values of the first breaking strength and the second breaking strength of the heat-resisting rubber of which the elastic body in the ventilation component 1 is formed means values at the time of shipping the ventilation component 1. For example, the above-mentioned specimen is fabricated using a material identical to a material of the heat-resisting rubber of which the elastic body in the ventilation component 1 is formed, in accordance with conditions of forming the elastic body included in the ventilation valve 20.

The heat-resisting rubber is not limited to a specific rubber as long as the above-mentioned rate of change in breaking strength is 95% to 120%. The heat-resisting rubber can be ACM, AEM, ANM, CM, CSM, EBM, EOM, EPDM, EPM, EVM, FEPM, FFKM, FKM, IM, NBM, SEBM, SEPM, CO, ECO, GCO, GECO, GPO, FMQ, FVMQ, MQ, PMQ, PVMQ, VMQ, ABR, BR, CR, CR, ENR, HNBR, IIR, IR, MSBR, NBIR, NBR, NIR, NR, NOR, PBR, PSBR, SBR, E-SBR, S-SBR, SIBR, XBR, XCR, XNBR, XSBR, BIIR, CIIR, OT, EOT, AFMU, AU, EU, FZ, or PZ. These abbreviations are used in accordance with JIS K 6397:2005.

The second breaking strength of the heat-resisting rubber of which the elastic body in the ventilation component 1 is formed is 5 to 10 MPa, for example. Thereby, the pressure to open the ventilation valve 20 is likely to fall in a desired range more reliably during the period in which the ventilation component 1 is used. The second breaking strength of the heat-resisting rubber of which the elastic body in the ventilation component 1 is formed is desirably 6 to 9 MPa, and more desirably 7 to 8 MPa.

As for HIS-30, HIS-35, HIS-40, HIS-45, HIS-50, HIS-55, and HIS-60, the first breaking strength, the second breaking strength, and the rate of change in breaking strength were calculated. Table 1 shows the results. These are silicone rubbers. As shown in Table 1, HIS-30, HIS-40, HIS-45, HIS-50, HIS-55, and HIS-60 can be used as the heat-resisting rubber.

| Type of rubber | First breaking strength (with heat resistance test) [MPa] | Second breaking strength (without heat resistance test) [MPa] | Rate of change in breaking strength [%] |
|---|---|---|---|
| HIS-30 | 7.6 | 7.8 | 97 |
| HIS-35 | 7.0 | 7.7 | 91 |
| HIS-40 | 8.2 | 7.5 | 109 |
| HIS-45 | 7.7 | 7.7 | 100 |
| HIS-50 | 8.6 | 7.6 | 113 |

-continued

| Type of rubber | First breaking strength (with heat resistance test) [MPa] | Second breaking strength (without heat resistance test) [MPa] | Rate of change in breaking strength [%] |
|---|---|---|---|
| HIS-55 | 7.3 | 7.4 | 99 |
| HIS-60 | 7.2 | 7.2 | 100 |

As shown in FIG. 2, the ventilation valve 20 includes an approximately plate-like structural portion having two faces 20f and 20s facing respective directions opposite to each other. The structural portion is formed of the elastic body, and the elastic body is formed of the heat-resisting rubber. In addition, the structural portion has a minimum thickness of 2.0 mm to 4.0 mm, for example. The heat-resisting rubber has a durometer hardness, specified in JIS K 6253-3:2012, of A 30 to 80.

Figure 6A:
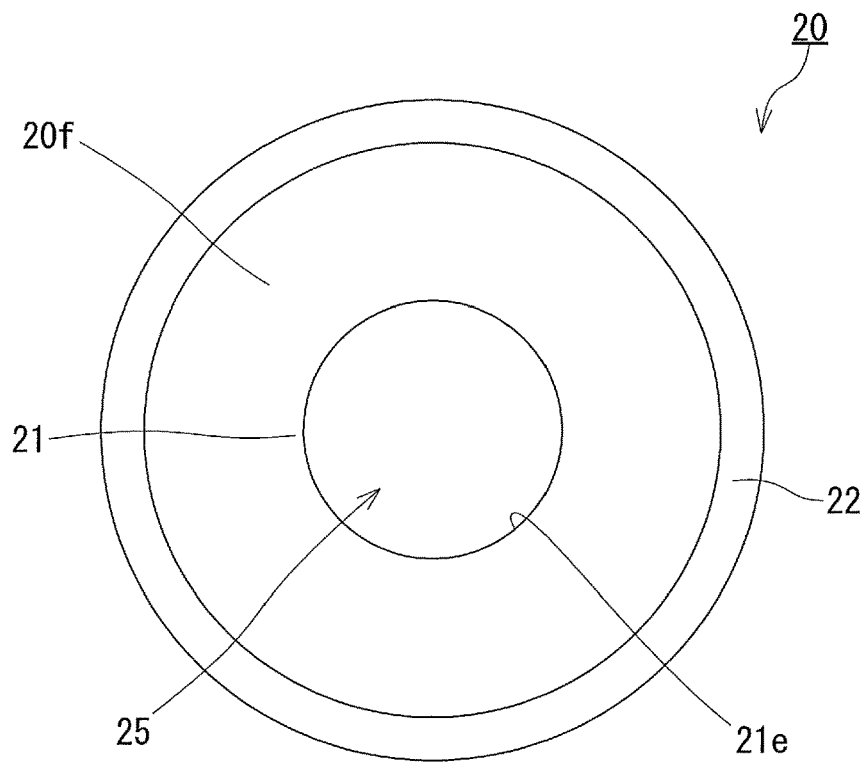
FIG. 6A is a plan view of the ventilation valve.
Figure 6B:
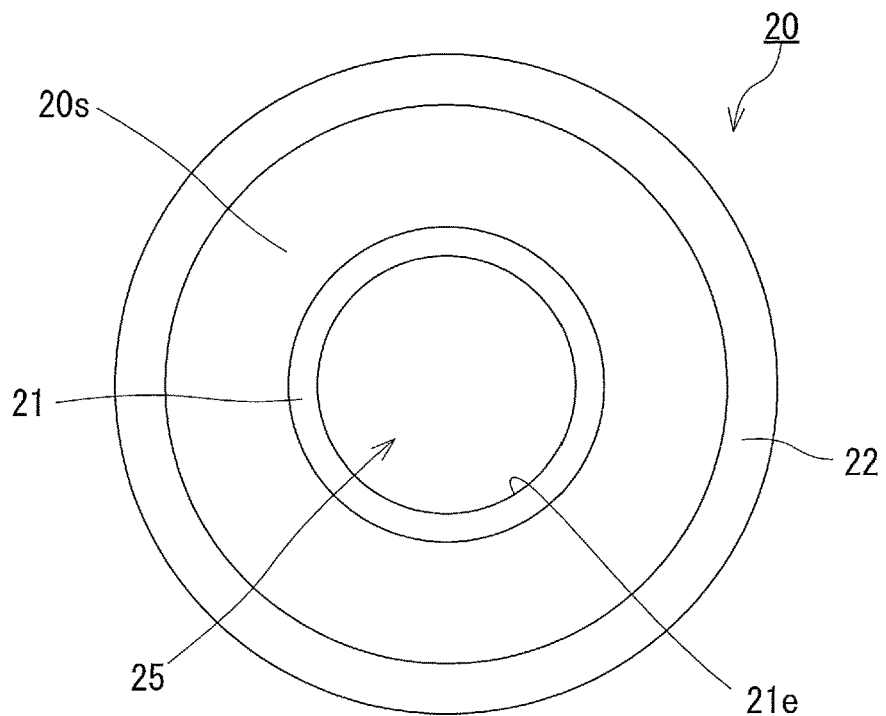
FIG. 6B is a plan view of the ventilation valve.

As shown in FIG. 6A and FIG. 6B, the ventilation valve 20 is a kind of so-called umbrella valve (an umbrella-type release valve), and has an annular shape including an inner circumferential portion 21 and an outer circumferential portion 22 when one of the two faces 20f and 20s is viewed in plane, for example. The ventilation valve 20 has a through hole 25 at a center thereof. The inner circumferential portion 21 is adjacent to the through hole 25. In addition, as shown in FIG. 2, the structural member 30 has a support portion 35 and a valve seat portion 36. The support portion 35 supports the inner circumferential portion 21. As shown in FIG. 4 and FIG. 5, the valve seat portion 36 is in contact with the outer circumferential portion 22 when the ventilation valve 20 is closed, and is out of contact with the outer circumferential portion 22 when the ventilation valve is opened. The umbrella valve usually includes a valve portion that serves for opening and closing, and a shaft portion that supports the valve portion. There is also an umbrella valve that has a member forming the valve portion and another separate member forming the shaft portion. For example, the ventilation valve 20 forms the valve portion only, and the valve portion has an annular shape when viewed in plane. The structural member 30 functions as the shaft portion supporting the ventilation valve 20 that is the valve portion. The through hole 25 of the ventilation valve 20 is used to support the ventilation valve 20 by using the structural member 30. Furthermore, when the ventilation component 1 is viewed in plane, the gas-permeable membrane 10 is positioned inner than an inner circumferential surface forming the through hole 25 of the ventilation valve 20. As described herein, the through hole 25 of the ventilation valve 20 has a size sufficient enough to accommodate the gas-permeable membrane 10.

The ventilation valve 20 is not limited to one with a particular shape as long as the ventilation valve 20 is opened by its elastic deformation and is closed by returning to a shape that it had before the deformation. The ventilation valve 20 may be a type of so-called duckbill valve, or may be a type of umbrella valve. In the case where the ventilation valve 20 is an umbrella valve, the ventilation valve 20 may include the valve portion and the shaft portion, or may be composed only of the valve portion. In the case where the ventilation valve 20 is an umbrella valve composed only of the valve portion, the ventilation valve 20 may have a through hole, or may not have a through hole. In the case where the ventilation valve 20 is an umbrella valve having a through hole, the through hole has a shape that is not limited to a specific one and the through hole has dimensions that are not limited to specific values.

As shown in FIG. 1 and FIG. 2, the structural member 30 has an engagement portion 32c, for example. The engagement portion 32c is to be inserted into the ventilation opening 5 of the housing 2. The ventilation component 1 further includes a seal member 60, for example. As shown in FIG. 4, the seal member 60 seals a gap between the structural member 30 and an outer surface 2s, of the housing 2, to which the ventilation component 1 is attached in the attached state. This can inhibit a liquid from being guided to the inside of the housing 2 through the gap between the structural member 30 and the outer surface 2s. The seal member 60 is an O-ring or a packing, for example. Examples of a material of the seal member 60 include an elastically-deformable material.

A material of the seal member 60 is an elastomer such as a natural rubber, a synthetic rubber, and a thermoplastic elastomer, for example. In this case, examples of the synthetic rubber include NBR, EPDM, a silicone rubber, a fluororubber, an acrylic rubber, and a hydrogenated nitrile rubber.

The gas-permeable membrane 10 is not limited to a specific membrane as long as it has a desired ventilating property. The gas-permeable membrane 10 may be a single layer membrane, or may be a multilayer membrane. In the case where the gas-permeable membrane 10 is a multilayer membrane, each layer thereof can be one selected from the group consisting of a porous membrane, a nonwoven fabric, a cloth, and a mesh. The gas-permeable membrane 10 may include: a porous membrane and a nonwoven fabric; at least one of a cloth and a mesh, and a porous membrane; or a plurality of nonwoven fabrics. Typically, the gas-permeable membrane 10 is composed of an organic polymer material (resin). Examples of a material of the porous membrane include fluororesin. As the fluororesin, there can be used polytetrafluoroethylene (PTFE), polychlorotrifluoroethylene, a tetrafluoroethylene-hexafluoropropylene copolymer, or a tetrafluoroethylene-ethylene copolymer, for example. Examples of a material of each of the nonwoven fabric, the cloth, and the mesh include polyester, such as polyethylene terephthalate, polyolefin, such as polyethylene and polypropylene, nylon, aramid, and an ethylene-vinyl acetate copolymer.

The gas-permeable membrane 10 may be subject to a liquid-repellent treatment as necessary. The liquid-repellent treatment is carried out by forming, on the gas-permeable membrane 10, a liquid-repellant coating film containing a fluorine-based surface modifier having a perfluoroalkyl group, for example. The formation of the liquid-repellant coating film is not particularly limited, and it is carried out, for example, by coating a resin porous membrane with a solution or dispersion of the fluorine-based surface modifier having a perfluoroalkyl group by a method such as an air spray method, an electrostatic spray method, a dip coating method, a spin coating method, a roll coating method, a curtain flow coating method, and an impregnation method. Alternatively, the liquid-repellant coating film may be formed by an electrodeposition method or a plasma polymerization method.

The ventilation valve 20 is opened by its elastic deformation and is closed by returning to a shape that it had before the deformation. Thereby, the ventilation valve 20 can be opened and closed repeatedly, and can be used repeatedly. This brings an advantage that a product in which the ventilation component 1 is attached to the housing 2 can be shipped after being inspected to see whether the ventilation valve 20 works normally.

Figure 7:
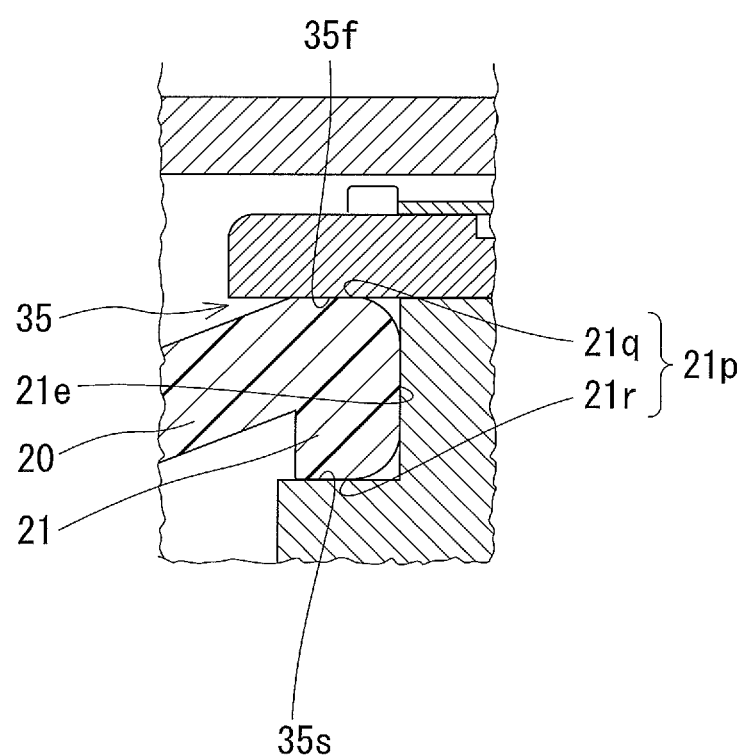
FIG. 7 is a partially-enlarged cross-sectional view of the ventilation component shown in FIG. 1.

As shown in FIG. 7, the support portion 35 has a first contact portion 35*f* and a second contact portion 35*s*, for example. The first contact portion 35*f* and the second contact portion 35*s* sandwich the inner circumferential portion 21 of the ventilation valve 20. The first contact portion 35*f* is in contact with a face 21*q* that is one of a pair of faces 21*p* facing respective directions opposite to each other in the inner circumferential portion 21. In addition, the second contact portion 35*s* is in contact with a face 21*r* that is the other face of the pair of faces 21*p* in the inner circumferential portion 21. The support portion 35 is in contact with an end face 21*e*, of the inner circumferential portion 21, connecting the pair of faces 21*p* between the first contact portion 35*f* and the second contact portion 35*s*. The inner circumferential portion 21 is sandwiched by the first contact portion 35*f* and the second contact portion 35*s*, and is in contact with the support portion 35 also at the end face 21*e*. This enhances sealability between the ventilation valve 20 and the support portion 35. As a result, a liquid and a gas fail to pass a gap between the support portion 35 and the inner circumferential portion 21, making it possible to enhance the reliabilities of the ventilation component 1 and a product to which the ventilation component 1 is attached.

For example, in a state where the elastic body of the ventilation valve 20 is pressed against the support portion 35 by its elastic deformation, the end face 21*e* of the inner circumferential portion 21 is in contact with the support portion 35. In this case, the sealability between the ventilation valve 20 and the support portion 35 is enhanced.

The inner circumferential portion 21 is in contact with the support portion 35 liquid-tightly at the end face 21*e*, for example. Desirably, the inner circumferential portion 21 is in contact with the support portion 35 liquid-tightly and air-tightly at the end face 21*e*. In this case, the sealability between the ventilation valve 20 and the support portion 35 is more likely to be enhanced. In this case, "air-tightly" means that a difference between pressures in respective two spaces separated by the end face 21*e* can be kept to 10 kPa or more.

The first contact portion 35*f* and the second contact portion 35*s* are in contact with the inner circumferential portion 21 in a state where the elastic body of the ventilation valve 20 is pressed against the inner circumferential portion 21 in such a manner as to be deformed elastically, for example. The first contact portion 35*f* and the second contact portion 35*s* are in contact with the inner circumferential portion 21 liquid-tightly, for example. Desirably, the first contact portion 35*f* and the second contact portion 35*s* are in contact with the inner circumferential portion 21 liquid-tightly and air-tightly. In this case, "air-tightly" means that a difference between pressures in respective two spaces separated by the first contact portion 35*f* or the second contact portion 35*s* can be kept to 10 kPa or more.

As shown in FIG. 2, the face 20*f* of the ventilation valve 20 is formed in such a manner as to create no step between a portion, of the ventilation valve 20, adjacent to the inner circumferential portion 21 and the inner circumferential portion 21, for example. Thereby, an area of contact between the inner circumferential portion 21 and the support portion 35 is likely to be increased.

As shown in FIG. 2, the face 20*s* of the ventilation valve 20 is formed in such a manner as to create a step between the portion, of the ventilation valve 20, adjacent to the inner circumferential portion 21 and the inner circumferential portion 21, for example. Thereby, the inner circumferential portion 21 has a thickness greater than that of the portion, of the ventilation valve 20, adjacent to the inner circumferential portion 21. Thereby, a deformation amount of the inner circumferential portion 21 sandwiched by the support portion 35 is likely to be increased, which enhances the sealability between the ventilation valve 20 and the support portion 35.

As shown in FIG. 2, the structural portion of the ventilation valve 20 has a bent portion between a portion, of the ventilation valve 20, adjacent to the outer circumferential portion 22 and the outer circumferential portion 22, and the bent portion is bent toward an inside of the ventilation valve 20. Thereby, an area of contact between the outer circumferential portion 22 and the valve seat portion 36 is likely to be increased in a state where the ventilation valve 20 is closed. As a result, sealability between the outer circumferential portion 22 and the valve seat portion 36 is increased in the state where the ventilation valve 20 is closed.

As shown in FIG. 2, the structural member 30 has a first member 31 and a second member 32, for example. The first member 31 supports the gas-permeable membrane 10. The first member 31 includes a base portion 31*b* and a shaft portion 31*s*. The base portion 31*b* has a disk shape and supports the gas-permeable membrane 10, for example. The base portion 31*b* has, at a center thereof, a through hole 31*h* for ventilation. The base portion 31*b* supports a peripheral portion of the gas-permeable membrane 10 outside the through hole 31*h* in a direction perpendicular to an axis of the base portion 31*b*. The gas-permeable membrane 10 is fixed to the base portion 31*b* by a method such as thermal welding, ultrasonic welding, and bonding with an adhesive. The shaft portion 31*s* protrudes from the center of the base portion 31*b* to an axial direction of the base portion 31*b*. The shaft portion 31*s* is cylindrical, and has a plurality (three, for example) of leg portions 31*g* at positions away from the base portion 31*b* in the axial direction of the base portion 31*b*. The leg portions 31*g* are arranged to be away from each other at equal angles around the axis of the base portion 31*b*, for example. Each of the leg portions 31*g* has, at a tip thereof, an engagement portion 31*c* protruding in the direction perpendicular to the axis of the base portion 31*b*. Gas goes in and out through an inside of the base portion 31*s*, or through a gap between the leg portions 31*g* and the through hole 31*h* to carry out ventilation.

The second member 32 forms a bottom portion and a side portion of the structural member 30. The second member 32 is an annular member, and includes an inner circumferential portion 32*i*, an outer circumferential portion 32*e*, and a connecting portion 32*k*. The inner circumferential portion 32*i* is positioned at a center of the second member 32 and is cylindrical. The outer circumferential portion 32*e* is away from the inner circumferential portion 32*i* in a direction perpendicular to an axis of the inner circumferential portion 32*i*, and surrounds the inner circumferential portion 32*i*. The outer circumferential portion 32*e* is cylindrical. The outer circumferential portion 32*e* forms the side portion of the structural member 30. The connecting portion 32*k* is positioned between the outer circumferential portion 32*e* and the inner circumferential portion 32*i* in the direction perpendicular to the axis of the inner circumferential portion 32*i*, and connects the outer circumferential portion 32*e* to the inner circumferential portion 32*i*. The inner circumferential portion 32*i* and the connecting portion 32*k* form the bottom portion of the structural member 30. The inner circumferential portion 32*i* has, at a center thereof, an attaching hole 32*h* that is a through hole. The first member 31 is attached to the second member 32 at one end portion of the inner circumferential portion 32*i* in an axial direction of the inner circumferential portion 32*i*. At the one end portion of the inner circumferential portion 32*i*, the attaching hole 32*h* forms a tapered hole. In addition, the inner circumferential portion 32*i* has an annular engagement face 32*f* that is adjacent to the tapered hole and extends in the direction perpendicular to the axis of the inner circumferential portion 32*i*. The shaft portion 31*s* is inserted into the tapered hole of the attaching hole 32*h*, and thus the engagement portions 31*c* face the engagement face 32*f* so as to prevent the first member 31 from being out of the attaching hole 32*h*. Moreover, an end face, adjacent to the tapered hole, of the inner circumferential portion 32*i* in the axial direction of the inner circumferential portion 32*i* faces a bottom face of the base portion 31*b* of the first member 31.

The support portion 35 is formed by the bottom face of the base portion 31*b* of the first member 31 and an outer surface of the one end portion of the inner circumferential portion 32*i* in the axial direction of the inner circumferential portion 32*i*, for example.

The inner circumferential portion 32*i* has an inner circumferential surface that is formed in such a manner as to make a plurality (three, for example) of steps from the engagement face 32*f* toward the other end portion of the inner circumferential portion 32*i* in the axial direction of the inner circumferential portion 32*i*. For example, the inner circumferential surface of the inner circumferential portion 32*i* has a first side face 32*p*, a second side face 32*q*, a third side face 32*r*, a first connecting face 32*t*, and a second connecting face 32*u*. The first side face 32*p*, the second side face 32*q*, and the third side face 32*r* extend in the axial direction of the inner circumferential portion 32*i*. In addition, the first side face 32*p*, the second side face 32*q*, and the third side face 32*r* respectively have a first inner diameter, a second inner diameter, and a third inner diameter. The first inner diameter is smaller than the second inner diameter, and the second inner diameter is smaller than the third inner diameter. The first connecting face 32*t* and the second connecting face 32*u* extend in the direction perpendicular to the axis of the inner circumferential portion 32*i*. The first connecting face 32*t* connects the first side face 32*p* to the second side face 32*q*. The second connecting face 32*u* connects the second side face 32*q* to the third side face 32*r*.

As shown in FIG. 1, the inner circumferential portion 32*i* includes a plurality (three, for example) of the engagement portions 32*c*, for example. The engagement portions 32*c* protrude outwardly in the direction perpendicular to the axis of the inner circumferential portion 32*i* at the other end portion of the inner circumferential portion 32*i* in the axial direction of the inner circumferential portion 32*i*, for example. The engagement portions 32*c* each are a plate-like portion curved in a circular arc shape, for example. The engagement portions 32*c* are arranged to be away from each other at equal angles around the axis of the inner circumferential portion 32*i*, for example. In the housing 2, a part of the ventilation opening 5 is formed by a plurality (three, for example) of protruding portions 5*p*, as shown in FIG. 3. The protruding portions 5*p* are arranged to be away from each other at equal angles around an axis of the ventilation opening 5. A plurality of recesses 5*r* forming a part of the ventilation opening 5 are present between the protruding portions 5*p*. At the time of attaching the ventilation component 1 to the housing 2, the ventilation component 1 is inserted into the ventilation opening 5 in such a manner that the engagement portions 32*c* pass respectively through the recesses 5*r*. Then, the ventilation component 1 is rotated by a predetermined angle around the axis of the inner circumferential portion 32*i* so that the engagement portions 32*c* face the protruding portions 5*p* inside the housing 2, and thereby the ventilation component 1 is attached to the housing 2. The protruding portions 5*p* and the engagement portions 32*c* work together to prevent the ventilation component 1 from being detached from the housing 2.

The ventilation valve 20 is attached to the inner circumferential portion 32*i* in such a manner as to be in contact with an outer circumferential surface, of the inner circumferential portion 32*i*, forming a part of the support portion 35. For example, the through hole 25 of the ventilation valve 20 has a diameter that is determined so that the ventilation valve 20 can be in contact with the outer circumferential surface of the inner circumferential portion 32*i*.

The connecting portion 32*k* has the valve seat portion 36 and functions as a valve seat for the ventilation valve 20, for example. The valve seat portion 36 is positioned in a peripheral portion of the connecting portion 32*k*. The connecting portion 32*k* has a flow path 32*d* to allow a gas to flow therethrough. The flow path 32*d* is formed in such a manner that it extends in the axial direction of the inner circumferential portion 32*i* between the valve seat portion 36 and the inner circumferential portion 32*i*. The flow path 32*d* causes the ventilation valve 20 to be subject to the pressure inside the housing 2.

The connecting portion 32*k* further has an annular recess 32*g*, for example. The seal member 60 is accommodated in the annular recess 32*g*. The annular recess 32*g* is formed in a bottom face of the connecting portion 32*k* in such a manner as to overlap with the valve seat portion 36 in the direction perpendicular to the axis of the inner circumferential portion 32*i*, for example.

The outer circumferential portion 32*e* extends along the axial direction of the inner circumferential portion 32*i* outside the connecting portion 32*k*. The outer circumferential portion 32*e* has an outward protruding portion 32*j* protruding outwardly in the direction perpendicular to the axis of the inner circumferential portion 32*i*.

The outer circumferential portion 32*e* has a plurality of inward protruding portions 32*v*, for example. The inward protruding portions 32*v* protrude inwardly in the direction perpendicular to the axis of the inner circumferential portion 32*i* at one end portion of the outer circumferential portion 32*e* in the axial direction of the inner circumferential portion 32*i*. The inward protruding portions 32*v* are arranged to be away from each other at predetermined intervals around the axis of the inner circumferential portion 32*i*.

As shown in FIG. 1 and FIG. 2, the structural member 30 further includes a third member 33, for example. The third member 33 is a member with a disk shape, for example. The third member 33 forms the inner space 40, together with the first member 31 and the second member 32. The gas-permeable membrane 10 and the ventilation valve 20 are accommodated in the inner space 40, for example. The third member 33 covers the gas-permeable membrane 10 and the ventilation valve 20, and protects the gas-permeable membrane 10 and the ventilation valve 20.

The third member 33 has a cover 33*c* with a disk shape, and an engagement claw 33*e*. The engagement claw 33*e* protrudes in an axial direction of the cover 33*c* from a peripheral portion of one principal surface of the cover 33*c*. A tip portion of the engagement claw 33*e* protrudes outwardly in a direction perpendicular to an axis of the cover 33*c*. The third member 33 is inserted into the outer circumferential portion 32*e* in such a manner that the engagement claw 33*e* passes through a gap between the inward protruding portions 32*v*. Then, the third member 33 is rotated around the axis of the cover 33c by a predetermined angle so that the tip portion of the engagement claw 33e faces the inward protruding portions 32v. In this way, the third member 33 is attached to the second member 32. The fact that the tip portion of the engagement claw 33e faces the inward protruding portions 32v prevents the third member 33 from being detached from the second member 32.

As shown in FIG. 1, the structural member 30 has a ventilation path 50. The ventilation path 50 allows the inner space 40 to communicate with an external space of the ventilation component 1 in such a manner that ventilation can be carried out. The ventilation path 50 is formed between the connecting portion 32k and an inner surface of the outer circumferential portion 32e, for example.

Examples of a material of the structural member 30 include a synthetic resin and a metal. As the synthetic resin, a thermoplastic resin can be used, for example. Examples of the thermoplastic resin include polybutylene terephthalate (PBT), polyethylene terephthalate (PET), polyphenylene sulfide (PPS), polysulfone (PS), polypropylene (PP), polyethylene (PE), and an ABS resin. The material of the structural member 30 may be a composite material containing the thermoplastic resin as a matrix. In this case, a reinforcement to be added to the composite material can be glass fiber, carbon fiber, a metal, or an inorganic filler.

As shown in FIG. 4, when the difference between the pressure inside the housing 2 and the pressure outside the housing 2 is less than the predetermined value, the ventilation valve 20 is closed, which makes it impossible for the gas inside the housing 2 to move to the outside of the housing 2 through the flow path 32d. Therefore, the gas goes into and out from the housing 2 through a flow path including the attaching hole 32h of the inner circumferential portion 32i, the through hole 31h of the first member 31, the gas-permeable membrane 10, the inner space 40, and the ventilation path 50. In contrast, as shown in FIG. 5, when the difference between the pressure inside the housing 2 and the pressure outside the housing 2 is equal to or higher than the predetermined value, the ventilation valve 20 is opened and the gas inside the housing 2 is discharged to the outside of the housing 2 through a flow path including the flow path 32d, the inner space 40, and the ventilation path 50. The gas-permeable membrane 10 is not disposed in the gas flow path formed when the ventilation valve 20 is opened, and thus a lot of gas can be discharged from the inside of the housing 2 in a short period of time. It should be noted that there is a case where a rapid rise of the pressure inside a housing damages a gas-permeable membrane, etc. even when a ventilation valve is provided. However, the ventilation component 1 has a structure that can inhibit such a phenomenon. As a means to prevent the damage of the gas-permeable membrane, etc., it can be considered to provide a structure that allows the gas inside the housing to be discharged to the outside of the housing via the ventilation valve. For that purpose, it is important to adjust a size of a cross section of a flow path through which the gas passes, and a size of the valve portion of the ventilation valve that closes the flow path. The ventilation component 1 has an annular shape in which the ventilation valve 20 has a through hole at a center thereof when viewed in plane. Furthermore, the ventilation component 1 has a structure in which the gas-permeable membrane 10 is accommodated in such a manner that the gas-permeable membrane 10 is positioned inner than the inner circumferential surface forming the through hole 25 of the ventilation valve 20 when viewed in plane. Thus, the cross section of the flow path through which the gas passes and the valve portion of the ventilation valve 20 are secured as large as possible in a limited space in the ventilation component 1. Thereby, when the pressure inside the housing 2 rises rapidly, the ventilation valve 20 is opened and the gas is discharged promptly to the outside of the housing 2 through the flow path including the flow path 32d, the inner space 40, and the ventilation path 50.

The ventilation component 1 can be modified in various respects. For example, the ventilation valve 20 may have a ring shape other than an annular shape when one of the two faces 20f and 20s is viewed in plane. In this case, a part or all of an outline of each of the inner circumferential portion 21 and the outer circumferential portion 22 may be a curve or may be a straight line when one of the two faces 20f and 20s is viewed in plane.

The invention claimed is:

1. A ventilation component to be attached to a housing at a ventilation opening of the housing, comprising:
   a gas-permeable membrane;
   a ventilation valve that includes an elastic body, and that is opened and closed by elastic deformation of the elastic body; and
   a structural member that supports the gas-permeable membrane and the ventilation valve, wherein
   in an attached state where the ventilation component is attached to the housing, ventilation between an inside of the housing and an outside of the housing is carried out via the gas-permeable membrane, and the ventilation valve is opened to discharge a gas inside the housing to the outside of the housing when a difference between a pressure inside the housing and a pressure outside the housing is equal to or higher than a predetermined value,
   the elastic body is formed of a rubber whose rate of change in breaking strength, determined by formula (1) below, is 95% to 120%:

Rate of change in breaking strength=100×first breaking strength/second breaking strength   (1)

where the first breaking strength is a breaking strength observed when a specimen that is made of the rubber, has a thickness of 2.0 mm, and has been punched into No. 3 dumbbell shape is heated in accordance with Heat Resistance Test, Method A, specified in Japanese Industrial Standard (JIS) K 6257:2010 and is then subject to a tensile test at a tensile rate of 500 mm/minute,
   the second breaking strength is a breaking strength observed when the specimen is subject to a tensile test at a tensile rate of 500 mm/minute without being heated in accordance with the Heat Resistance Test, Method A,
   the ventilation valve includes a structural portion that is formed of the elastic body and is shaped like a plate having two faces facing respective directions opposite to each other,
   the structural portion has a minimum thickness of 2.0 mm to 4.0 mm, and
   the rubber has a durometer hardness, specified in JIS K 6253-3:2012, of A 30 to 80.

2. The ventilation component according to claim 1, wherein the second breaking strength of the rubber is 5 to 10 MPa.

3. The ventilation component according to claim 1, wherein the structural portion has an annular shape including an inner circumferential portion and an outer circumferential portion when one of the two faces is viewed in plane, and the structural member has a support portion that supports the inner circumferential portion, and a valve seat portion that is in contact with the outer circumferential portion when the ventilation valve is closed and that is out of contact with the outer circumferential portion when the ventilation valve is opened.

4. The ventilation component according to claim 1, further comprising a seal member that seals a gap between the structural member and an outer surface, of the housing, to which the ventilation component is attached in the attached state, wherein the structural member has an engagement portion to be inserted into the ventilation opening of the housing.

\* \* \* \* \*